United States Patent [19]

Kohsiek

[11] Patent Number: 4,550,262

[45] Date of Patent: Oct. 29, 1985

[54] VOLTAGE-CURRENT CONVERTER HAVING REFERENCE RESISTOR SPREAD COMPENSATION

[75] Inventor: Cord H. Kohsiek, Hamburg, Fed. Rep. of Germany

[73] Assignee: U.S. Philips Corporation, New York, N.Y.

[21] Appl. No.: 716,519

[22] Filed: Mar. 26, 1985

Related U.S. Application Data

[63] Continuation of Ser. No. 439,141, Nov. 4, 1982, abandoned.

[30] Foreign Application Priority Data

Apr. 15, 1982 [DE] Fed. Rep. of Germany ....... 3213838

[51] Int. Cl.$^4$ .......................... H03K 3/26; G05F 3/08
[52] U.S. Cl. .................................. 307/260; 307/297; 323/315; 323/316; 330/288
[58] Field of Search .................. 307/296 R, 297, 491, 307/288, 260, 261; 323/312, 315, 316; 330/288

[56] References Cited

U.S. PATENT DOCUMENTS

| | | | |
|---|---|---|---|
| 3,825,774 | 7/1974 | Kessel et al. ................... | 307/297 X |
| 3,909,628 | 9/1975 | Muto ............................... | 307/297 X |
| 3,979,606 | 9/1976 | Ahmed ............................ | 307/296 X |
| 4,330,744 | 5/1982 | Embree et al. ................. | 307/297 X |
| 4,427,903 | 1/1984 | Sugimoto ........................ | 307/297 X |
| 4,442,400 | 4/1984 | Nagano .......................... | 323/315 |

OTHER PUBLICATIONS

Amanteo, "Voltage-to-Current Converter"; RCA Technical Notes, TN No.: 1242, 3 Sheets; 5/28/80.
Hamilton et al., *Basic Integrated Circuit Engineering;* pp. 144-162; McGraw-Hill Co., 1975.

*Primary Examiner*—Larry N. Anagnos
*Attorney, Agent, or Firm*—Robert T. Mayer; Steven R. Biren

[57] ABSTRACT

The invention relates to an integrated voltage-current converter circuit for generating a current which produces a voltage drop across a reference resistor, which voltage drop is determined by an input voltage. In order to compensate for the spread in width of the reference resistor formed in the integrated circuit, this reference resistor is formed by two parallel-connected resistors having the same resistance per unit area, the same length and different widths, and the compensated output current is formed by the difference between the currents which flows through these resistors.

6 Claims, 2 Drawing Figures

VOLTAGE-CURRENT CONVERTER HAVING REFERENCE RESISTOR SPREAD COMPENSATION

This is a continuation of application Ser. No. 439,141 filed Nov. 4, 1982, now abandoned.

BACKGROUND OF THE INVENTION

The invention relates to an integrated circuit for generating a current which produces a voltage drop across a reference resistor, which voltage drop is determined by an input voltage. Such a circuit is generally referred to as a voltage-current converter.

In an integrated circuit the accuracy of a voltage-current conversion across a reference resistor of predetermined value depends on the spread of this reference resistor. The spread of this resistor mainly depends on the resistance per unit area of the layer of material forming the resistor and on the spread in width of the resistance track.

In a monolithic integrated semiconductor circuit, the resistance per unit area depends on the quotient of the specific resistance of the doped zone forming the resistor and the thickness of this doped zone. The spread in width of the resistance track depends on the tolerances of the process which determines the structure of the doped zone (photolithography, etching). Therefore, it was found to be impossible to effect a voltage-current conversion with a small spread by means of an integrated circuit.

SUMMARY OF THE INVENTION

It is the object of the invention to construct an integrated circuit of the type mentioned above in such a way that the accuracy of the voltage-current conversion depends only on the (comparatively small) spread of the resistance per unit area and not on the spread in the width of the resistance track.

According to the invention this object is achieved by a second current generated in a branch which is arranged in parallel with the reference resistor, which second current produces a voltage drop, which voltage drop is determined by the same input voltage, across a second reference resistor which is arranged in the second branch, which has the same resistance per unit area, which has the same length and which has a different width, and the difference between the currents flowing through said reference resistors forms the output current of the circuit.

In a circuit thus constructed comprising two resistors, to each of which the input voltage is applied, the current components as a result of the spread in width are equal and cancel each other when the difference between the currents is formed, because the absolute spread in width of the two resistors is the same.

Preferably, the difference between the currents flowing through the resistors is formed by means of a current mirror.

In order to isolate the currents flowing through the two resistors from each other it is advantageous to arrange the resistors in the emitter lines of two transistors, whose bases are driven by the input voltage.

As in such a circuit the sum of the input voltage and the base-emitter voltage of the transistors appears across the resistors, it is effective to drive the bases of the two transistors via operational amplifiers, which compensate for the base-emitter voltages of these transistors.

In order to minimize the base current, and consequently the difference between the collector and the emitter current, of the transistors in whose emitter lines the resistors are arranged these transistors are preferably Darlington transistors or field-effect transistors.

Preferably the circuit is constructed as a monolithic integrated semiconductor circuit and the resistors are formed by doped zones in the semiconductor body.

BRIEF DESCRIPTION OF THE DRAWING

Embodiments of the invention will now be described in more detail, by way of example, with reference to the drawing. In the drawing.

DESCRIPTION OF THE PREFERRED EMBODIMENTS

Figure 1:
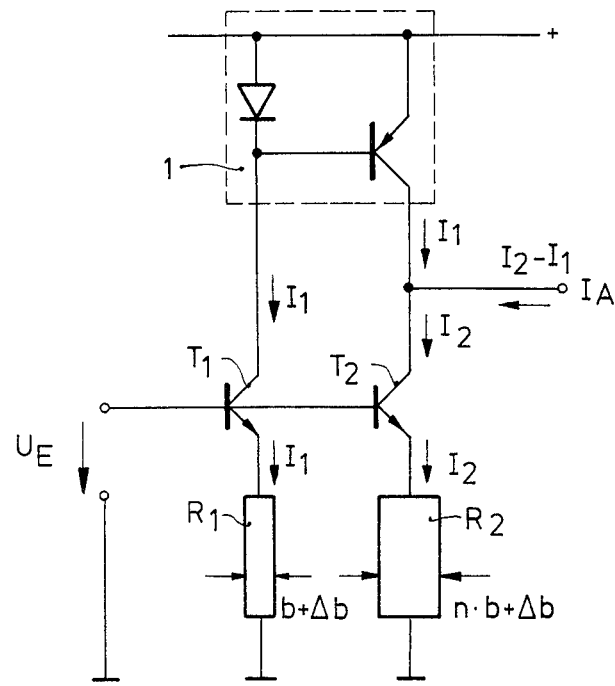
FIG. 1 is a circuit diagram of a circuit in accordance with the invention.

FIG. 1 is a diagram representing a circuit for generating an output current $I_A$ which produces a voltage drop across a reference resistor, which voltage drop is determined by an input voltage $U_E$, which circuit is generally referred to as a "voltage-current converter". In the present case the reference resistor is formed by two resistors $R_1$ and $R_2$, having the same resistance per unit area, the same length, but different widths. The resistor $R_1$ has the width $b+\Delta b$, while the resistor $R_2$ has the width $n \cdot b + \Delta b$. The two resistors receive the input voltage $U_E$ via the transistors $T_1$ and $T_2$, the resistors being arranged in the emitter lines and the input voltage being applied to the bases of these transistors. The collector currents of the transistors $T_1$ and $T_2$ are supplied by a current mirror 1. The complexity of this current mirror depends on the required accuracy of the conversion ratio. For generating the output current $I_A$, the difference between the two currents $I_1$ and $I_2$ is formed, which difference produces the same voltage drop, i.e. the input voltage $U_E$, across the resistors $R_1$ and $R_2$ of different width but equal length. Since the absolute spread in width of the two resistors is the same, the current components as a result of the spread in width (actual width minus nominal width of the resistors) for the same input voltage $U_E$ are equal and cancel each other when the difference of the currents is formed.

If:
$R_S$ = the layer resistance
$l$ = the resistor length
$b$ = the width of the resistor $R_1$
$n \cdot b$ = the width of the resistor $R_2$
$\Delta b$ = the spread in resistor width then the following relationships are valid:

$$R_1 = R_S \cdot \frac{l}{b + \Delta b}$$

and $$R_2 = R_S \cdot \frac{l}{n \cdot b + \Delta b}.$$

This means that the input voltage $U_E$ produces a current $$I_1 = U_E \cdot \frac{b + \Delta b}{R_S \cdot 1}$$

in the resistor $R_1$ and a current $$I_2 = U_E \cdot \frac{n \cdot b + \Delta b}{R_S \cdot 1}$$

in the resistor $R_2$.

The current difference $I_A$, which forms the output current, is calculated as follows $$I_A = I_2 - I_1 = U_E \cdot \frac{(n-1)b}{R_S \cdot 1},$$

Thus, $I_A$ no longer contains the spread in width $\Delta b$, but only the nominal width $b$, i.e. the output current $I_A$ no longer depends on the spread in width of the resistors $R_1$ and $R_2$.

In the circuit shown in FIG. 1, instead of the input voltage $U_E$, the sum of this voltage and the base-emitter voltage of the respective transistor $T_1$ or $T_2$ actually appears across the resistors $R_1$ and $R_2$, so that it may be necessary to compensate for these base-emitter voltages if required to obtain the desired accuracy of the circuit.

Figure 2:
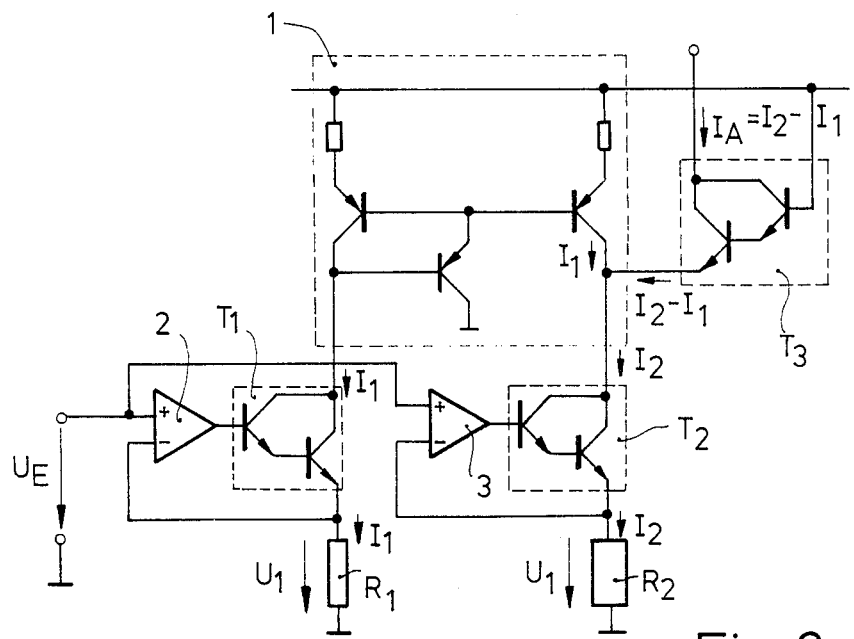
FIG. 2 is a circuit diagram of a second circuit in accordance with the invention.

FIG. 2 shows a circuit diagram of a circuit in accordance with the invention in which for this purpose the bases of the two transistors $T_1$ and $T_2$ are driven by the input voltage $U_E$ via operational amplifiers 2 and 3. The output of each operational amplifier is connected to the base of the associated transistor. The input voltage $U_E$ is applied to the noninverting input of each operational amplifier, while the inverting input of each operational amplifier is connected to the emitter of the associated transistor. In this way only the input voltage $U_E$ appears across the resistors $R_1$ and $R_2$; the base-emitter voltages are thus compensated for.

In principle, the circuit shown in FIG. 2 is identical to the circuit shown in FIG. 1. However, the current mirror is more complex, so that the accuracy of the conversion ratio is higher and the output current $I_A$ is taken from the current mirror 1 by means of a transistor $T_3$, which is a Darlington transistor. The transistors $T_1$ and $T_2$ are also Darlington transistors in order to minimize the base currents of these two transistors, and consequently the difference between the collector current and the emitter current of each transistor. For this purpose the two transistors $T_1$ and $T_2$ may alternatively be field-effect transistors.

What is claimed is:

1. An integrated substantially linear voltage-current converter circuit for generating an output current, which produces a voltage drop across a first reference resistor, which voltage drop is determined by an input voltage, comprising means for compensating for the spread in resistor width by generating a second current in a circuit branch which is arranged in parallel with said first reference resistor, which second current produces a voltage drop, which voltage drop is determined by the input voltage across a second resistor which is arranged in the circuit branch, which has the same resistance per unit area, the same length, and a different width than that of the first resistor, and means for generating said output current as a function of the difference between the currents flowing through said first and second reference resistors.

2. A circuit as claimed in claim 1, wherein said means for generating said output current as a function of the difference between the currents flowing through the resistors comprises a current mirror.

3. A circuit as claimed in claim 1, further comprising two transistors, wherein the resistors are arranged in the emitter lines of said two transistors, whose bases are driven by the input voltage.

4. A circuit as claimed in claim 3, further comprising two operational amplifiers, wherein the bases of the two transistors are driven via said operational amplifiers, which compensate for the base-emitter voltages of these transistors.

5. A circuit as claimed in claim 4, wherein the transistors as arranged are Darlington transistors.

6. A circuit as claimed in claim 1, constructed as a monolithic integrated semiconductor circuit with the resistors being formed by doped zones in the semiconductor body.

* * * * *